(12) United States Patent
Nguyen et al.

(10) Patent No.: US 11,283,008 B1
(45) Date of Patent: Mar. 22, 2022

(54) APPARATUS AND METHODS FOR MAGNETIC MEMORY DEVICES WITH MAGNETIC ASSIST LAYER

(71) Applicant: Western Digital Technologies, Inc., San Jose, CA (US)

(72) Inventors: Thao A. Nguyen, San Jose, CA (US); Michael Ho, Redwood City, CA (US); Zhigang Bai, Fremont, CA (US); Xiaoyong Liu, San Jose, CA (US); Zhanjie Li, Pleasanton, CA (US); Yongchul Ahn, San Jose, CA (US); Hongquan Jiang, San Jose, CA (US); Quang Le, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 17/172,190

(22) Filed: Feb. 10, 2021

Related U.S. Application Data

(60) Provisional application No. 63/072,397, filed on Aug. 31, 2020.

(51) Int. Cl.
  *G11C 11/18* (2006.01)
  *H01L 43/04* (2006.01)
  (Continued)

(52) U.S. Cl.
  CPC ............ *H01L 43/04* (2013.01); *G11C 11/161* (2013.01); *G11C 11/1675* (2013.01);
  (Continued)

(58) Field of Classification Search
  CPC ....... H01L 43/04; H01L 27/222; H01L 43/06; G11C 11/161; G11C 11/1675; G11C 11/18
  (Continued)

(56) References Cited

U.S. PATENT DOCUMENTS

| 10,340,901 B2 | 7/2019 | Yoshinari et al. |
| 10,528,643 B1 | 1/2020 | Choi et al. |

(Continued)

FOREIGN PATENT DOCUMENTS

| JP | 6620915 | 12/2019 |

OTHER PUBLICATIONS

Fan et al., "Energy Efficient In-Memory Binary Deep Neural Network Accelerator with Dual-Mode SOT-MRAM", 2017 EEE International Conference on Computer Design (ICCD), Nov. 5-8, 2017 https://ieeexplore.ieee.org/document/8119280.

(Continued)

*Primary Examiner* — Michael T Tran
(74) *Attorney, Agent, or Firm* — Vierra Magen Marcus LLP

(57) ABSTRACT

An apparatus is provided that includes a magnetic tunnel junction, a magnetic assist layer coupled to the magnetic tunnel junction, a non-magnetic layer disposed between the free layer and the magnetic assist layer, and a spin Hall effect layer coupled to the magnetic assist layer. The magnetic tunnel junction includes a free layer in a plane, the free layer including a switchable magnetization direction perpendicular to the plane. The magnetic assist layer includes a magnetization direction parallel to the plane and free to rotate about an axis perpendicular to the plane.

20 Claims, 8 Drawing Sheets

(51) Int. Cl.
*H01L 27/22* (2006.01)
*G11C 11/16* (2006.01)
*H01L 43/06* (2006.01)

(52) U.S. Cl.
CPC ............ *G11C 11/18* (2013.01); *H01L 27/222* (2013.01); *H01L 43/06* (2013.01)

(58) Field of Classification Search
USPC .................................................. 365/158, 173
See application file for complete search history.

(56) References Cited

U.S. PATENT DOCUMENTS

| | | | | |
|---|---|---|---|---|
| 10,832,710 | B1* | 11/2020 | Song | G11B 5/012 |
| 2007/0077454 | A1* | 4/2007 | Sakamoto | H01F 41/026 |
| | | | | 428/693.1 |
| 2014/0056061 | A1* | 2/2014 | Khvalkovskiy | G11C 11/161 |
| | | | | 365/158 |
| 2014/0176184 | A1* | 6/2014 | Johnson | H03K 19/017581 |
| | | | | 326/37 |
| 2015/0213868 | A1* | 7/2015 | Wu | H03K 3/35625 |
| | | | | 365/154 |
| 2016/0300999 | A1* | 10/2016 | Yi | G11C 11/1675 |
| 2016/0372656 | A1* | 12/2016 | Pinarbasi | G11C 11/1675 |
| 2017/0178705 | A1* | 6/2017 | Buhrman | G11C 11/1673 |
| 2017/0330070 | A1* | 11/2017 | Sengupta | H01L 43/08 |
| 2018/0033954 | A1* | 2/2018 | Aradhya | H01F 10/3272 |
| 2018/0061467 | A1* | 3/2018 | Kan | G11C 11/1675 |
| 2019/0131977 | A1 | 5/2019 | Obradovic et al. | |
| 2019/0265074 | A1* | 8/2019 | Gaydov | G01D 5/24428 |
| 2019/0272870 | A1 | 9/2019 | Choi et al. | |
| 2020/0012924 | A1 | 1/2020 | Ma et al. | |
| 2020/0034686 | A1 | 1/2020 | Chiu et al. | |
| 2020/0035910 | A1 | 1/2020 | Li et al. | |
| 2020/0058847 | A1* | 2/2020 | Lee | G11C 11/1675 |
| 2020/0075099 | A1* | 3/2020 | Choi | G11C 11/1673 |
| 2020/0168790 | A1* | 5/2020 | Oikawa | H01F 10/3272 |
| 2020/0312908 | A1* | 10/2020 | Oguz | H01L 43/14 |
| 2021/0202827 | A1* | 7/2021 | Song | H01L 43/02 |

OTHER PUBLICATIONS

Ohno et al., "Spin-orbit Torque Devices for Digital and Neuromorphic Computing", Sep. 28, 2017 http://csrn-osaka.sakura.ne.jp/kanamori-memorial/abstract-session-Spintronics/S4-Ohno.pdf.

Milo et al., "Memristive and CMOS Devices for Neuromorphic Computing", Dipartimento di Elletronica, Informazione e Biongengneria, Politecnico di Milano and Italian Universities Nanoelectronics Team (IU.NET), Jan. 1, 2020 https://www.mdpi.com/1996-1944/13/1/166/htm.

Torrejon et al., "Neuromorphic computing with nanoscale spintronic oscillators", nature.com, Jul. 27, 2017, https://arxiv.org/ftp/arxiv/papers/1701/1701.07715.pdf.

Andrew Myers, "Small, fast, energy-efficient memory to spur new computer applications", engineering.stanford.edu, Nov. 6, 2018, https://engineering.stanford.edu/magazine/article/small-fast-energy-efficient-memory-spur-new-computer-applications.

Deliang Fan et al., "Injection-Locked Spin Hall-Induced Coupled-Oscillators for Energy Efficient Associative Computing", IEEE Transactions on Nanotechnology, vol. 14, No. 6, Nov. 2015.

U.S. Appl. No. 17/172,155, filed Feb. 10, 2021.
U.S. Appl. No. 17/172,175, filed Feb. 10, 2021.

* cited by examiner

US 11,283,008 B1

APPARATUS AND METHODS FOR MAGNETIC MEMORY DEVICES WITH MAGNETIC ASSIST LAYER

CLAIM OF PRIORITY

The present application claims priority from U.S. Provisional Patent Application No. 63/072,397, entitled "APPARATUS AND METHODS FOR MAGNETIC MEMORY DEVICES WITH MAGNETIC ASSIST LAYER," filed Aug. 31, 2020, incorporated by reference herein in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include, but are not limited to, magnetoresistive memory (e.g., MRAM), phase change memory (e.g., PCM) ferroelectric field effect transistor (FeFET) memory, ferroelectric memory (e.g., FeRAM), and flash memory (e.g., NAND-type and NOR-type flash memory).

DETAILED DESCRIPTION

Technology is described for a three-terminal MRAM non-volatile memory cell that includes a spin Hall effect layer, a magnetic assist layer, and a magnetic tunnel junction that includes a free layer in a plane. The free layer includes a switchable magnetization direction perpendicular to the plane. The magnetic assist layer is coupled to the magnetic tunnel junction, and includes a magnetization direction parallel to the plane and free to rotate about an axis perpendicular to the plane.

The MRAM non-volatile memory cell is programmed by applying a first voltage pulse across the spin Hall effect layer to generate a spin orbit torque to cause the magnetization direction of the magnetic assist layer to oscillate, and a second voltage pulse across the magnetic tunnel junction and the magnetic assist layer to generate a spin transfer torque to cause the magnetization direction of the free layer to deterministically switch.

Figure 1A:
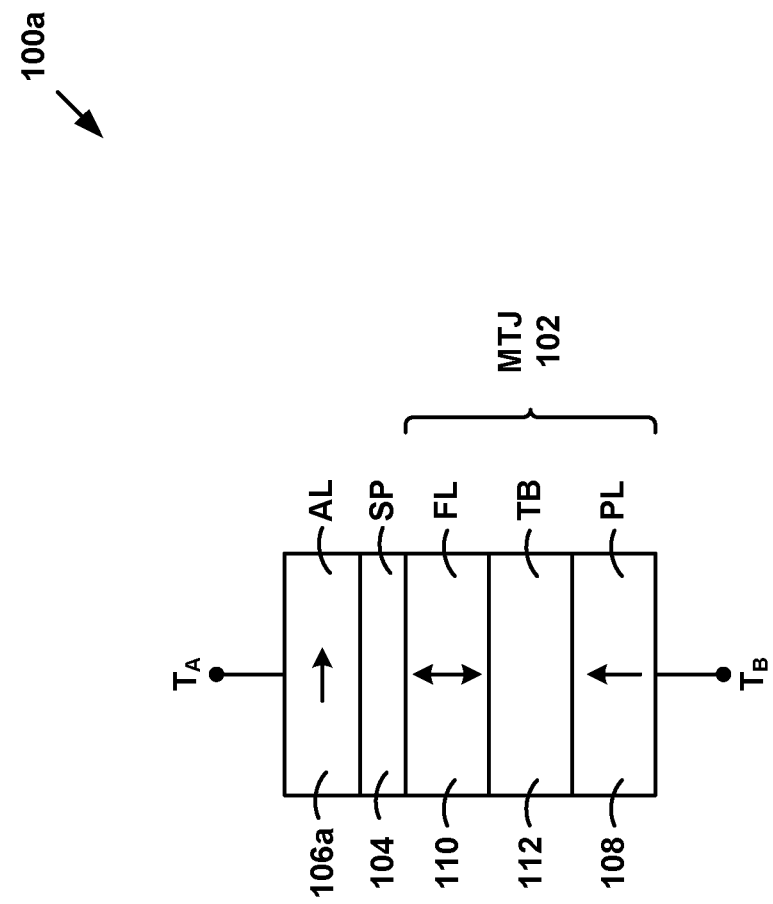
FIG. 1A depicts an example MRAM non-volatile memory cell.
Figure 1A:
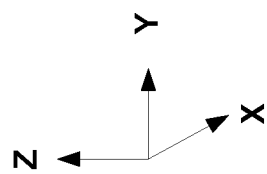

FIG. 1A is a simplified cross-sectional view of an MRAM non-volatile memory cell 100a. MRAM non-volatile memory cell 100a is a two-terminal device that includes a magnetic tunnel junction (MTJ) 102, a non-magnetic spacer layer 104 disposed above MTJ 102, and a magnetic assist layer 106a disposed above non-magnetic spacer layer 104. Non-magnetic spacer layer 104 may be magnesium oxide (MgO), copper (Cu) or other non-magnetic material. Magnetic assist layer 106a has an in-plane magnetization direction that is fixed.

MTJ 102 includes a reference (or pinned) layer (PL) 108, a free layer (FL) 110, and a tunnel barrier (TB) 112 positioned between pinned layer 108 and free layer 110. Tunnel barrier 112 is an insulating layer, such as magnesium oxide (MgO) or other insulating material. Pinned layer 108 is a ferromagnetic layer with a fixed magnetization direction. Free layer 110 is a ferromagnetic layer and has a magnetization direction that can be switched. In an embodiment, MRAM non-volatile memory cell 100a has a first terminal $T_A$ coupled to magnetic assist layer 106a, and a second terminal $T_B$ coupled to pinned layer 108.

Pinned layer 108 is usually a synthetic antiferromagnetic layer which includes several magnetic and non-magnetic layers, but for the purpose of this illustration is depicted as a single layer 108 with fixed magnetization direction. Pinned layer 108 and free layer 110 each have a magnetization direction perpendicular to the film plane (e.g., the x-y plane in FIG. 1A), rather than in-plane. Such a magnetization direction will be referred to herein as a "perpendicular magnetization direction." Magnetic assist layer 106a has a magnetization direction that is perpendicular to the magnetization direction of pinned layer 108 and free layer 110.

When the magnetization direction of free layer 110 is parallel to the magnetization direction of pinned layer 108, the resistance of MRAM non-volatile memory cell 100a is relatively low. When the magnetization direction of free layer 110 is anti-parallel to the magnetization direction in pinned layer 108, the resistance of MRAM non-volatile memory cell 100a is relatively high.

Thus, the resistance of MRAM non-volatile memory cell 100a may therefore be used to store one bit of data. In an embodiment, MRAM non-volatile memory cell 100a may be programmed to either a low resistance ON state or a high resistance OFF state. In an embodiment, the low resistance ON state may be used to represent a first value (e.g., "1"), and the high resistance OFF state may be used to represent a second value (e.g., "0"). The data ("0" or "1") in MRAM non-volatile memory cell 100a may be read by measuring the resistance of MRAM non-volatile memory cell 100a.

The spin of an electron is an intrinsic angular momentum. In a solid, the spins of many electrons can act together to affect the magnetic and electronic properties of a material, for example endowing it with a permanent magnetic moment as in a ferromagnet. In many materials, electron spins are equally present in both up and down directions. However, various techniques can be used to generate a spin-polarized population of electrons, resulting in an excess of spin up or spin down electrons, to change the properties of a material. This spin-polarized population of electrons moving in a common direction through a common material is referred to as a spin current.

Spin transfer torque (STT) switching may be used to change the magnetization direction of free layer 110 of MRAM non-volatile memory cell 100ab. When a write current is conducted from first terminal $T_A$ to second terminal $T_B$ of MRAM non-volatile memory cell 100a, electrons in the write current become spin-polarized as they pass through magnetic assist layer 106a. In particular, magnetic assist layer 106a polarizes the electrons with a spin orientation corresponding to the magnetization direction of magnetic assist layer 106a, and thus produces a spin-polarized current.

The spin polarized electrons pass through non-magnetic spacer layer 104 and impart a spin transfer torque on the magnetization of free layer 110, which helps initiate switching the magnetization direction of free layer 110. In particular, the spin transfer torque helps to initiate precession of the magnetization direction of free layer 110. That is, the magnetization direction of free layer 110 turns on itself in a continuous manner with sustained oscillations until the magnetization direction of free layer 110 switches by 180°.

The spin polarized electrons from magnetic assist layer 106a provide the initial spin transfer torque on the magnetization of free layer 110 to start the precession. In particular, in the first half of the precession the spin transfer torque provided by the spin polarized electrons from magnetic assist layer 106a is in the opposite direction as the inherent damping of free layer 110, and helps overcome the inherent damping of free layer 110. In the second half of the precession, however, the spin transfer torque provided by the spin polarized electrons from magnetic assist layer 106a is in the same direction as the inherent damping of free layer 110, and thus impairs the precession of the magnetization direction of free layer 110.

Indeed, the spin polarized electrons from magnetic assist layer 106a (which has a fixed magnetization direction) can only provide a spin transfer torque in the same fixed direction. Thus, half the time the spin transfer torque provided by the spin polarized electrons from magnetic assist layer 106a is helping to switch the magnetization direction of free layer 110, and the other half of the time the spin transfer torque is hurting free layer 110 precession, which is a significant limitation.

Figure 1B:
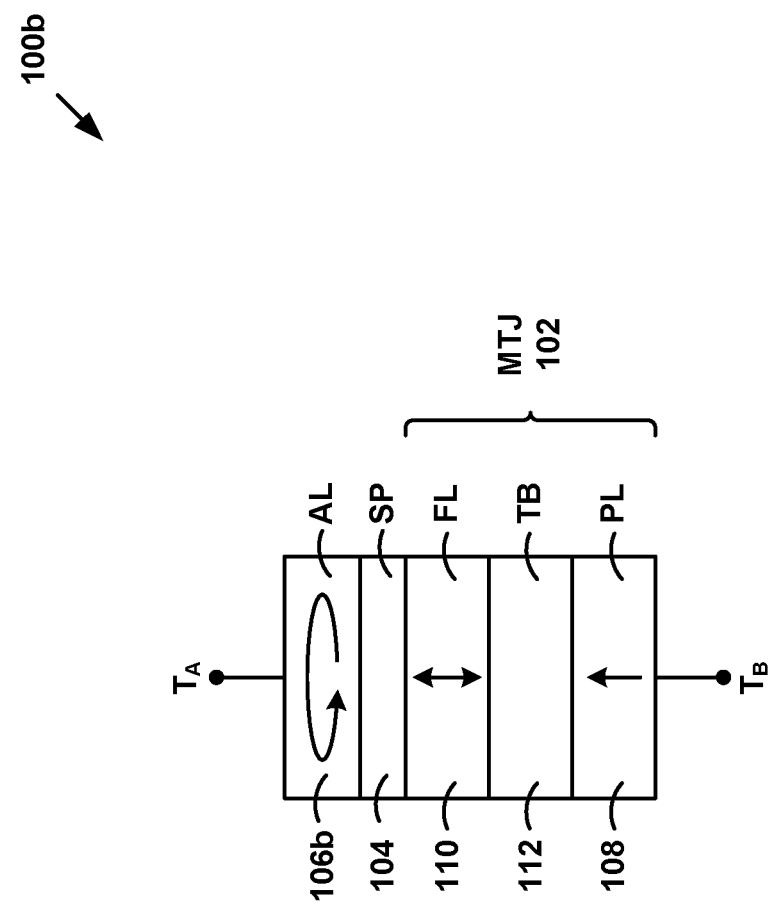
FIG. 1B depicts another example MRAM non-volatile memory cell.
Figure 1B:
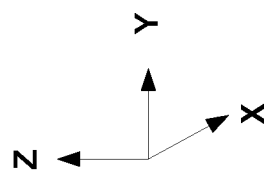

FIG. 1B is a simplified cross-sectional view of an MRAM non-volatile memory cell 100b. MRAM non-volatile memory cell 100b is a two-terminal device that includes MTJ 102, non-magnetic spacer layer 104 disposed above MTJ 102, and a magnetic assist layer 106b disposed above non-magnetic spacer layer 104. MRAM non-volatile memory cell 100b is similar to MRAM non-volatile memory cell 100a of FIG. 1A, except that magnetic assist layer 106b has a magnetization direction that is in-plane, but has no preferred direction and can freely rotate in-plane. In an embodiment, MRAM non-volatile memory cell 100b has a first terminal $T_A$ coupled to magnetic assist layer 106b, and a second terminal $T_B$ coupled to pinned layer 108.

Spin transfer torque switching may be used to change the magnetization direction of free layer 110 of MRAM non-volatile memory cell 100b. When a write current is conducted from first terminal $T_A$ to second terminal $T_B$ of MRAM non-volatile memory cell 100b, electrons in the write current become spin-polarized as they pass through magnetic assist layer 106b. The spin polarized electrons pass through non-magnetic spacer layer 104 and impart a spin transfer torque on the magnetization of free layer 110, which helps initiate precession of the magnetization direction of free layer 110.

Magnetic assist layer 106b and free layer 110 are magnetically coupled. In particular, as the magnetization direction of free layer 110 starts to precess, free layer 110 imparts a torque on the magnetization direction of magnetic assist layer 106b. As a result, this torque initiates precession of the magnetization direction of magnetic assist layer 106b, which follows the precessional rotation of the magnetization direction of free layer 110. In this regard, the precession of the magnetization direction of magnetic assist layer 106b is "passive," in the sense that precession of the magnetization direction of free layer 110 triggers the precession of the magnetization direction of magnetic assist layer 106b.

The rotating magnetization direction of magnetic assist layer 106b imparts a rotating spin transfer torque on the magnetization direction of free layer 110 to help switch the magnetization direction of free layer 110. The rotating spin transfer torque helps to overcome the inherent damping of free layer 110 throughout the entire precession cycle.

At the beginning of free layer 110 switching, the spin transfer torque from magnetic assist layer 106b helps to enhance the torque on the magnetization of free layer 110. Nevertheless, the magnetization direction of magnetic assist layer 106b remains largely in-plane. As a result, in the later stage of free layer 110 switching, the spin transfer torque from magnetic assist layer 106b acts to drag the magnetization direction of free layer 110 back to the in-plane direction. This hurts free layer 100 precession, which is also a significant limitation.

Figure 2:
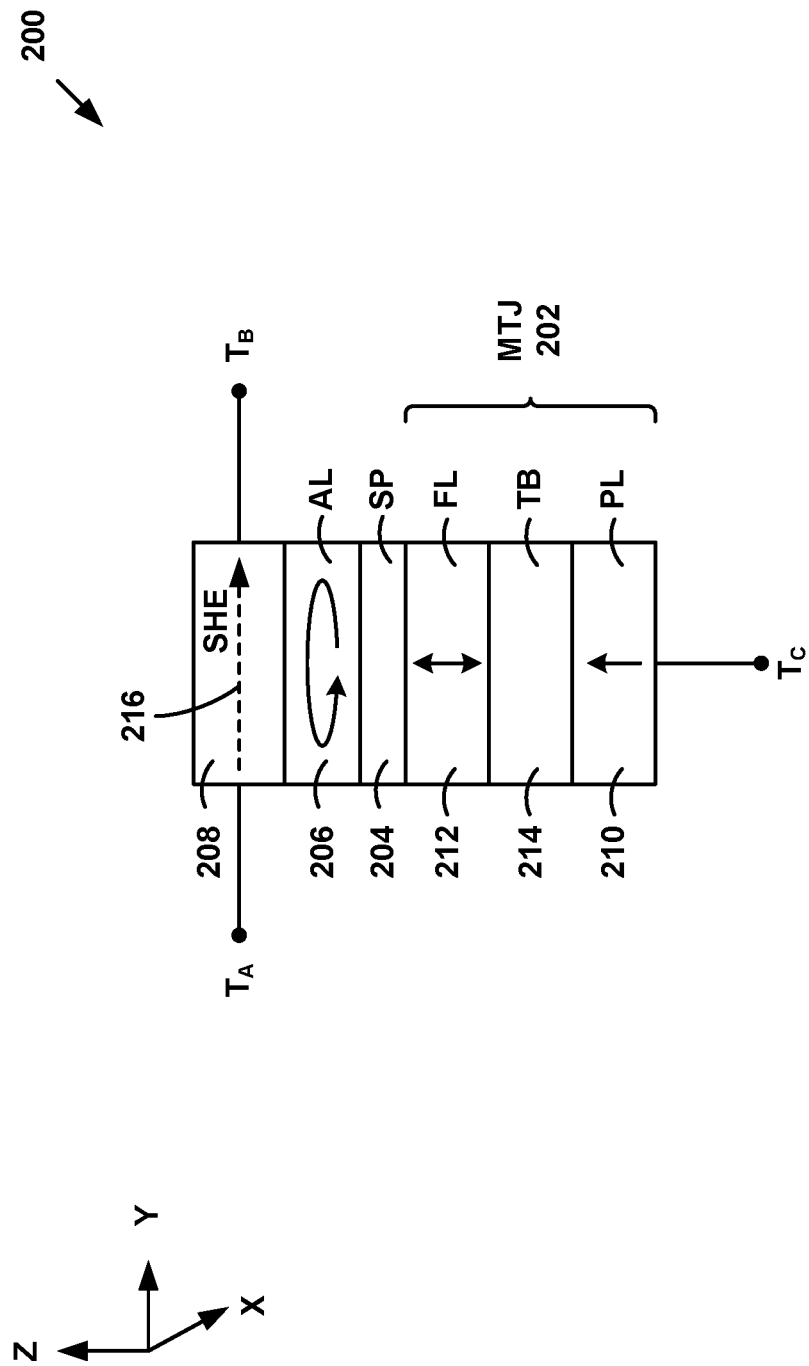
FIG. 2 depicts still another example MRAM non-volatile memory cell.

FIG. 2 is a simplified cross-sectional view of an MRAM non-volatile memory cell 200. MRAM non-volatile memory cell 200 is a three-terminal device that includes a MTJ 202, a non-magnetic spacer layer 204 disposed above MTJ 202, a magnetic assist layer 206 disposed above non-magnetic spacer layer 204, and a spin Hall effect (SHE) layer 208 disposed above non-magnetic spacer layer 204. Magnetic assist layer 206 has a magnetization direction that is in-plane, but has no preferred direction and can freely rotate in-plane.

Non-magnetic spacer layer 204 may be MgO, Cu or other non-magnetic material. In an embodiment, magnetic assist layer 206 may include CoFeB. In other embodiments, magnetic assist layer 206 may include Co, Fe, Ni magnetic layers, or magnetic layers including alloys of Co, Fe, Ni. In embodiments, the magnetic alloys can include boron, tantalum, copper or other materials.

In an embodiment, SHE layer 208 comprises a heavy metal with strong spin orbit coupling and large effective spin Hall angle. Examples of heavy metal materials include platinum, tungsten, tantalum, platinum gold (PtAu), bismuth bopper (BiCu). In other embodiments, SHE layer 208 comprises a topological insulator, such as bismuth antimony (BiSb), bismuth selenide ($Bi_2Se_3$), bismuth telluride ($Bi_2Te_3$) or antimony telluride ($Sb_2Te_3$). In particular embodiments, SHE layer 208 comprises BiSb with (012) orientation, which is a narrow gap topological insulator with both giant spin Hall effect and high electrical conductivity. In embodiments, SHE layer 208 may include a single material layer or may include a multi-layer structure.

MTJ 202 includes a pinned layer 210, a free layer 212, and a tunnel barrier 214 positioned between pinned layer 210 and free layer 212. Tunnel barrier 214 is an insulating layer, such as MgO or other insulating material. Pinned layer 210 is a ferromagnetic layer with a fixed magnetization direction. Free layer 212 is a ferromagnetic layer and has a magnetization direction that can be switched. In an embodiment, MRAM non-volatile memory cell 200 has a first terminal $T_A$ coupled to a first end of SHE layer 208, a second terminal $T_B$ coupled to a second end of SHE layer 208, and a third terminal Tc coupled to pinned layer 210.

Pinned layer 210 is usually a synthetic antiferromagnetic layer which includes several magnetic and non-magnetic layers, but for the purpose of this illustration is depicted as a single layer 210 with fixed magnetization direction. Pinned layer 210 and free layer 212 each have a perpendicular magnetization direction.

As described above, a spin-polarized population of electrons moving in a common direction through a common material is referred to as a spin current. The spin Hall effect is a transport phenomenon that may be used to generate a spin current in a sample carrying an electric current. The spin current is in a direction perpendicular to the plane defined by the electrical current direction and the spin polarization direction. The spin polarization direction of such a SHE-generated spin current is in the in-plane direction orthogonal to the electrical current flow.

For example, conducting an electrical current 216 from first terminal $T_A$ to second terminal $T_B$ of SHE layer 208 results in a spin current that exerts a spin orbit torque (or "kick") on magnetic assist layer 206. The spin orbit torque causes the magnetization direction of magnetic assist layer 206 to oscillate around the axis normal to the stack film plane. Terminating electrical current 216, turns OFF the SHE-generated spin current, and the magnetization direction of magnetic assist layer 206 stops oscillating. Thus, the oscillation of the magnetization direction of magnetic assist layer 206 can be selectively controlled by selectively applying (e.g., turning ON and OFF) current 216 from first terminal $T_A$ to second terminal $T_B$ of SHE layer 208.

As described below, a multi-step process may be used to deterministically switch the magnetization direction of free layer 212. In a first step a first voltage pulse is applied across SHE layer 208 for a first time period. In a second step commencing at the same time or shortly after application of the first voltage pulse, a second voltage pulse is applied across MTJ 202 and magnetic assist layer 206 for a second time period longer than the first time period. In a third step, the first voltage pulse is turned OFF while the second voltage pulse continues to be applied across MTJ 202 and magnetic assist layer 206. In a fourth step, the second voltage pulse is turned OFF.

Without wanting to be bound by any particular theory, it is believed that the first voltage pulse generates a spin orbit torque that causes magnetic assist layer 206 to oscillate. In addition, without wanting to be bound by any particular theory, it is believed that the second voltage pulse causes free layer 212 to experience a large spin transfer torque from magnetic assist layer 206 because the magnetization direction of magnetic assist layer 206 has a large angle with respect to the magnetization direction of free layer 212 when the second voltage pulse is applied.

Without wanting to be bound by any particular theory, it is believed that the spin transfer torque from magnetic assist layer 206 "kicks' free layer 212 into precession. Without wanting to be bound by any particular theory, it is believed that prior to turning OFF the first voltage pulse, magnetic assist layer 206 imparts a spin transfer torque on free layer 212 that facilitates precession of magnetization direction of free layer 212.

Without wanting to be bound by any particular theory, it is believed that when the first voltage pulse is turned OFF, the spin transfer torque from magnetic assist layer 206 is no longer facilitating precession of the magnetization direction of free layer 212. Without wanting to be bound by any particular theory, it is believed that after the first voltage pulse is turned OFF but before the second voltage pulse is turned OFF, pinned layer 210 imparts a spin transfer torque on free layer 212, and facilitates the completion of switching of the magnetization direction of free layer 212.

Figure 3A:
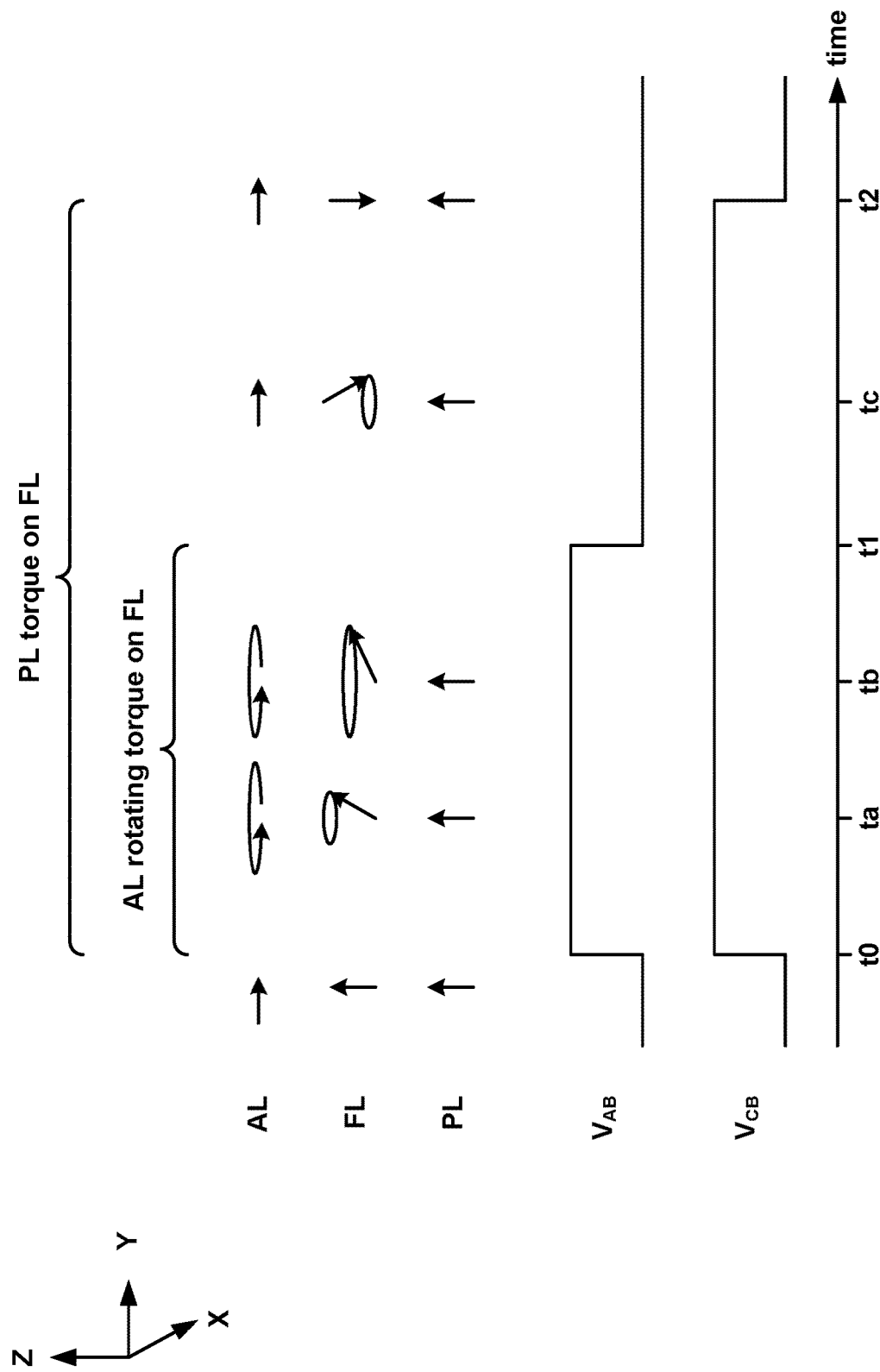
FIG. 3A illustrates a technique for programming the MRAM non-volatile memory cell of FIG. 2.

FIG. 3A illustrates a technique for programming MUM non-volatile memory cell 200 of FIG. 2. The top portion of FIG. 3A illustrates magnetization direction versus time for each of magnetic assist layer (AL) 206, free layer (FL) 212 and pinned layer (PL) 210. The bottom portion of FIG. 3A depicts voltage pulses applied to MUM non-volatile memory cell 200. In particular, $V_{AB}$ is a first voltage pulse applied across first terminal $T_A$ to second terminal $T_B$ of SHE layer 208, and $V_{CB}$ is a second voltage pulse applied across third terminal Tc to second terminal $T_B$ of MUM non-volatile memory cell 200.

Prior to time t0, the magnetization direction of each of magnetic assist layer 206 and free layer 212 is static (i.e., not rotating). In the illustrated example, magnetic assist layer 206 has a magnetization direction pointing in the +y direction, free layer 212 has magnetization direction that is pointing in the +z direction, and pinned layer 210 has magnetization direction that is pointing in the +z direction. Persons of ordinary skill in the art will understand that the magnetization direction of magnetic assist layer 206 and the magnetization direction of free layer 212 prior to time t0 may be other than as shown in FIG. 3A.

At time t0, first voltage pulse $V_{AB}$ is applied across first terminal $T_A$ and second terminal $T_B$ of SHE layer 208. In an embodiment, first voltage pulse $V_{AB}$ is applied across first terminal $T_A$ and second terminal $T_B$ during a first time interval from time t0 to time t1. Applying first voltage pulse $V_{AB}$ across first terminal $T_A$ and second terminal $T_B$ results in a spin current that exerts a spin orbit torque on magnetic assist layer 206 that causes the magnetization direction of magnetic assist layer 206 to oscillate. As illustrated in FIG. 3A, during a first time interval between time t0 and time t1 the magnetization direction of magnetic assist layer 206 oscillates.

Also at time t0, a second voltage pulse $V_{CB}$ is applied across third terminal Tc and second terminal $T_B$ of MRAM non-volatile memory cell 200. In an embodiment, second voltage pulse $V_{CB}$ is applied across third terminal Tc and second terminal $T_B$ during a second time interval from time t0 to time t2. In an embodiment, the second time interval is longer than the first time interval.

Magnetic assist layer 206 and free layer 212 are magnetically coupled. When second voltage pulse $V_{CB}$ is applied across third terminal Tc and second terminal $T_B$ of MRAM non-volatile memory cell 200, free layer 212 experiences a large spin transfer torque from magnetic assist layer 206 because the magnetization direction of magnetic assist layer 206 has a large angle with respect to the magnetization direction of free layer 212 at that instant.

As a result, the large spin transfer torque imparted on free layer 212 initiates precession of the magnetization direction of free layer 212. This is illustrated in FIG. 3A, which shows that at time to the magnetization direction of free layer 212 has begun precession. Later, at time tb, the oscillation of the magnetization direction of free layer 212 becomes larger, and is almost in-plane.

In an embodiment, second voltage pulse $V_{CB}$ results in a polarized spin current from pinned layer 210 that exerts a spin transfer torque on free layer 212, pulling the magnetization direction of free layer 212 back to the perpendicular direction. Nevertheless, during the first time interval between time t0 and time t1, the spin transfer torque from pinned layer 210 is insufficient to halt precession of the magnetization direction of free layer 212.

At time t1 (e.g., about 3-5 ns after time t0) first voltage pulse $V_{AB}$ turns OFF, the magnetization direction of magnetic assist layer 206 stops oscillating, and magnetic assist layer 206 stops imparting a spin transfer torque on free layer 212. Between time t1 and time t2, second voltage pulse $V_{CB}$ continues to be applied from third terminal Tc to second terminal $T_B$ of MRAM non-volatile memory cell 200, and the spin transfer torque from pinned layer 210 pulls the magnetization direction of free layer 212 to the perpendicular direction.

As depicted in FIG. 3A, at time tc the magnetization direction of free layer 212 continues to precess in a direction opposite the initial magnetization direction of free layer 212. By time t2, second voltage pulse $V_{CB}$ turns OFF, and the precession of the magnetization direction of free layer 212 has completed. In particular, by time t2 the magnetization direction of free layer 212 has switched 180° from the magnetization direction at time to. The total writing time in this embodiment is t2−t0.

Without wanting to be bound by any particular theory, it is believed that the in contrast to the passive magnetic assist layers 106a and 106b of FIGS. 1A and 1B, respectively, magnetic assist layer 206 of FIG. 2 is an active magnetic assist layer that may be used to provide enhanced initial torque on free layer 212 to assist the beginning stage of switching. In addition, without wanting to be bound by any particular theory, it is believed that the torque provide by magnetic assist layer 206 may subsequently be turned OFF to prevent undesired effects from magnetic assist layer 206 at later stage of free layer 212 switching.

Figure 3B:
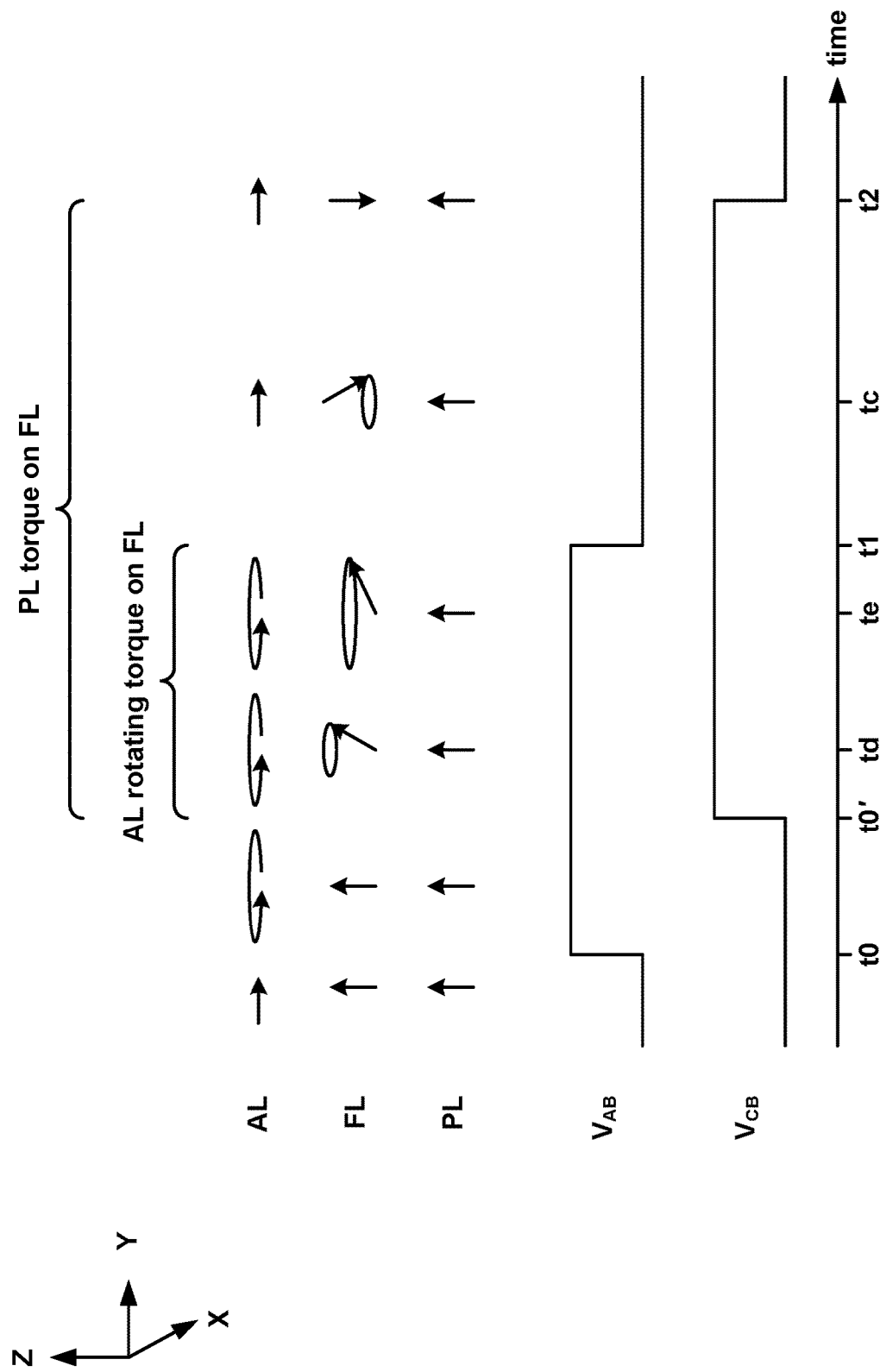
FIG. 3B illustrates another technique for programming the MRAM non-volatile memory cell of FIG. 2.

FIG. 3B illustrates an alternative technique for programming MRAM non-volatile memory cell 200 of FIG. 2. The technique of FIG. 3B is similar to that of FIG. 3A, except that second voltage pulse $V_{CB}$ is applied across third terminal Tc and second terminal $T_B$ of MRAM non-volatile memory cell 200 at time t0', after first voltage pulse $V_{AB}$ is applied across first terminal $T_A$ and second terminal $T_B$ of SHE layer 208 at time t0. The time difference t0'−t0 may be about 1-2 nanoseconds, or some other time difference.

Prior to time t0, the magnetization direction of each of magnetic assist layer 206 and free layer 212 is static (i.e., not rotating). In the illustrated example, magnetic assist layer 206 has a magnetization direction pointing in the +y direction, free layer 212 has magnetization direction that is pointing in the +z direction, and pinned layer 210 has a magnetization direction that is pointing in the +z direction. Persons of ordinary skill in the art will understand that the magnetization direction of magnetic assist layer 206 and the magnetization direction of free layer 212 prior to time t0 may be other than as shown in FIG. 3B.

At time t0, first voltage pulse $V_{AB}$ is applied across first terminal $T_A$ and second terminal $T_B$ of SHE layer 208. In an embodiment, first voltage pulse $V_{AB}$ is applied across first terminal $T_A$ and second terminal $T_B$ during a first time interval from time t0 to time t1. Applying first voltage pulse $V_{AB}$ across first terminal $T_A$ and second terminal $T_B$ results in a spin current that exerts a spin orbit torque on magnetic assist layer 206 that causes the magnetization direction of magnetic assist layer 206 to oscillate. As illustrated in FIG. 3B, during a first time interval between time t0 and time t1 the magnetization direction of magnetic assist layer 206 oscillates.

Until time t0 (when second voltage pulse $V_{CB}$ is applied across third terminal Tc and second terminal $T_B$ of MRAM non-volatile memory cell 200), the rotating magnetization direction of magnetic assist layer 208 does not impart a rotating spin transfer torque on the magnetization direction of free layer 212. Thus, as depicted in FIG. 3B, between time t0 and time t0', the magnetization direction of free layer 212 remains static (i.e., not rotating).

At time t0', second voltage pulse $V_{CB}$ is applied across third terminal Tc and second terminal $T_B$ of MRAM non-volatile memory cell 200. In an embodiment, second voltage pulse $V_{CB}$ is applied across third terminal Tc and second terminal $T_B$ during a second time interval from time t0' to time t2. In an embodiment, the second time interval is longer than the first time interval.

During a third time interval between time t0' and time t1 free layer 212 experiences a large spin transfer torque from magnetic assist layer 206 because the magnetization direction of magnetic assist layer 206 has a large angle with respect to the magnetization direction of free layer 212 at that instant. As a result, the large spin transfer torque imparted on free layer 212 initiates precession of the magnetization direction of free layer 212. This is illustrated in FIG. 3B, which shows that at time td the magnetization direction of free layer 212 has begun precession. Later, at time te, the oscillation of the magnetization direction of free layer 212 becomes larger, and is almost in-plane.

In an embodiment, second voltage pulse $V_{CB}$ results in a polarized spin current from pinned layer 210 that exerts a spin transfer torque on free layer 212, pulling the magnetization direction of free layer 212 back to the perpendicular direction. Nevertheless, during the third time interval between time t0 and time t1, the spin transfer torque from pinned layer 210 is insufficient to halt precession of the magnetization direction of free layer 212.

At time t1 (e.g., about 3-5 ns after time t0) first voltage pulse $V_{AB}$ turns OFF, the magnetization direction of magnetic assist layer 206 stops oscillating, and magnetic assist layer 206 stops imparting a spin transfer torque on free layer 212. Between time t1 and time t2, second voltage pulse $V_{CB}$ continues to be applied from third terminal Tc to second terminal $T_B$ of MRAM non-volatile memory cell 200, and the spin transfer torque from pinned layer 210 pulls the magnetization direction of free layer 212 back to the perpendicular direction.

As depicted in FIG. 3B, at time tc the magnetization direction of free layer 212 continues to precess in a direction opposite the initial magnetization direction of free layer 212. By time t2, second voltage pulse $V_{CB}$ turns OFF, and the precession of the magnetization direction of free layer 212 has completed. In particular, by time t2 the magnetization direction of free layer 212 has switched 180° from the magnetization direction at time to. The total writing time in this embodiment is t2−t0.

Without wanting to be bound by any particular theory, it is believed that the embodiment of FIG. 3B may provide energy savings compared to the embodiment of FIG. 3A. Also, FIG. 3B illustrates that free layer 212 switching does not require that first voltage pulse $V_{AB}$ and second voltage pulse $V_{CB}$ both are applied synchronously at time t0.

Figure 4:
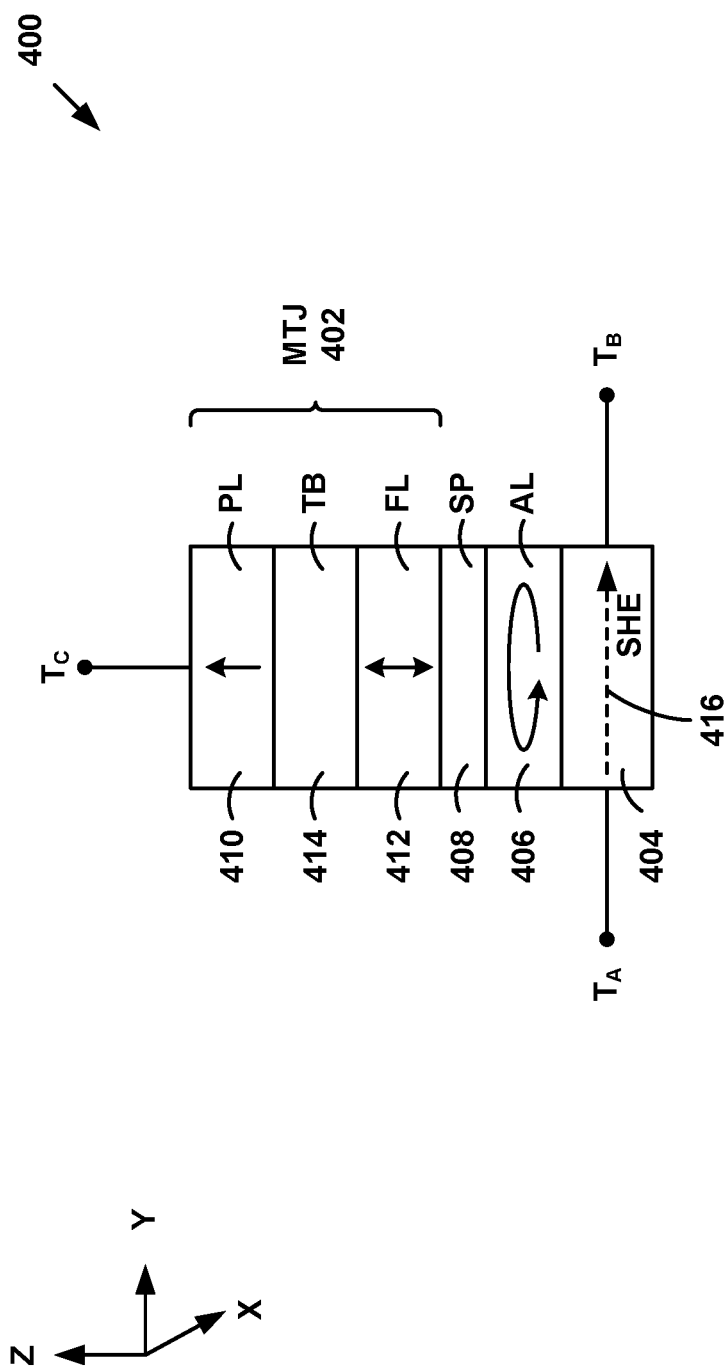
FIG. 4 depicts yet another example MRAM non-volatile memory cell.

FIG. 4 is a simplified cross-sectional view of an alternative MRAM non-volatile memory cell 400. MRAM non-volatile memory cell 400 has a MTJ 402 inverted with respect to the embodiment of FIG. 2. MRAM non-volatile memory cell 400 is a three-terminal device that includes a SHE layer 404, a magnetic assist layer 406 disposed above SHE layer 404, a non-magnetic spacer layer 408 disposed above magnetic assist layer 406, and MTJ 402 disposed above non-magnetic spacer layer 408. Magnetic assist layer 406 has a magnetization direction that is in-plane, but has no preferred direction and can freely rotate in-plane.

Non-magnetic spacer layer 408 may be MgO, Cu or other non-magnetic material. In an embodiment, magnetic assist layer 406 may include CoFeB. In other embodiments, magnetic assist layer 406 may include Co, Fe, Ni magnetic layers, or magnetic layers including alloys of Co, Fe, Ni. In embodiments, the magnetic alloys can include boron, tantalum, copper or other materials.

In an embodiment, SHE layer 404 comprises a heavy metal with strong spin orbit coupling and large effective spin Hall angle. Examples of heavy metal materials include platinum, tungsten, tantalum, PtAu, and BiCu. In other embodiments, SHE layer 404 comprises a topological insulator, such as BiSb, $Bi_2Se_3$, $Bi_2Te_3$ or $Sb_2Te_3$. In particular embodiments, SHE layer 404 comprises BiSb with (012) orientation, which is a narrow gap topological insulator with both giant spin Hall effect and high electrical conductivity. In embodiments, SHE layer 404 may include a single material layer or may include a multi-layer structure.

MTJ 402 includes a pinned layer 410, a free layer 412, and a tunnel barrier 414 positioned between pinned layer 410 and free layer 412. Tunnel barrier 414 is an insulating layer, such as MgO or other insulating material. Pinned layer 410 is a ferromagnetic layer with a fixed magnetization direction. Free layer 412 is a ferromagnetic layer and has a magnetization direction that can be switched. In an embodiment, MRAM non-volatile memory cell 400 has a first terminal $T_A$ coupled to a first end of SHE layer 404, a second terminal $T_B$ coupled to a second end of SHE layer 404, and a third terminal Tc coupled to pinned layer 410.

Pinned layer 410 is usually a synthetic antiferromagnetic layer which includes several magnetic and non-magnetic layers, but for the purpose of this illustration is depicted as a single layer 410 with fixed magnetization direction. Pinned layer 410 and free layer 412 each have a perpendicular magnetization direction.

Conducting an electrical current 416 from first terminal $T_A$ to second terminal $T_B$ of SHE layer 404 results in a spin current that exerts a spin orbit torque on magnetic assist layer 406. The spin orbit torque causes the magnetization direction of magnetic assist layer 406 to oscillate around the axis normal to the stack film plane. Terminating electrical current 416, turns OFF the SHE-generated spin current, and the magnetization direction of magnetic assist layer 406 stops oscillating. As in the embodiment of FIG. 2, the oscillation of the magnetization direction of magnetic assist layer 406 can be selectively controlled by selectively applying current 416 from first terminal $T_A$ to second terminal $T_B$ of SHE layer 404.

Without wanting to be bound by any particular theory, it is believed that by selectively controlling the oscillation of the magnetization direction of magnetic assist layer 406, the spin transfer torque from magnetic assist layer 406 advantageously may be used during a first portion of a write operation to "kick" free layer 412 into precession. During a subsequent second portion of the write operation, the oscillation of the magnetization direction of magnetic assist layer 406 may be halted, when the spin transfer torque from magnetic assist layer 406 would otherwise act to drag the magnetization direction of free layer 412 back to the in-plane direction.

Figure 5A:
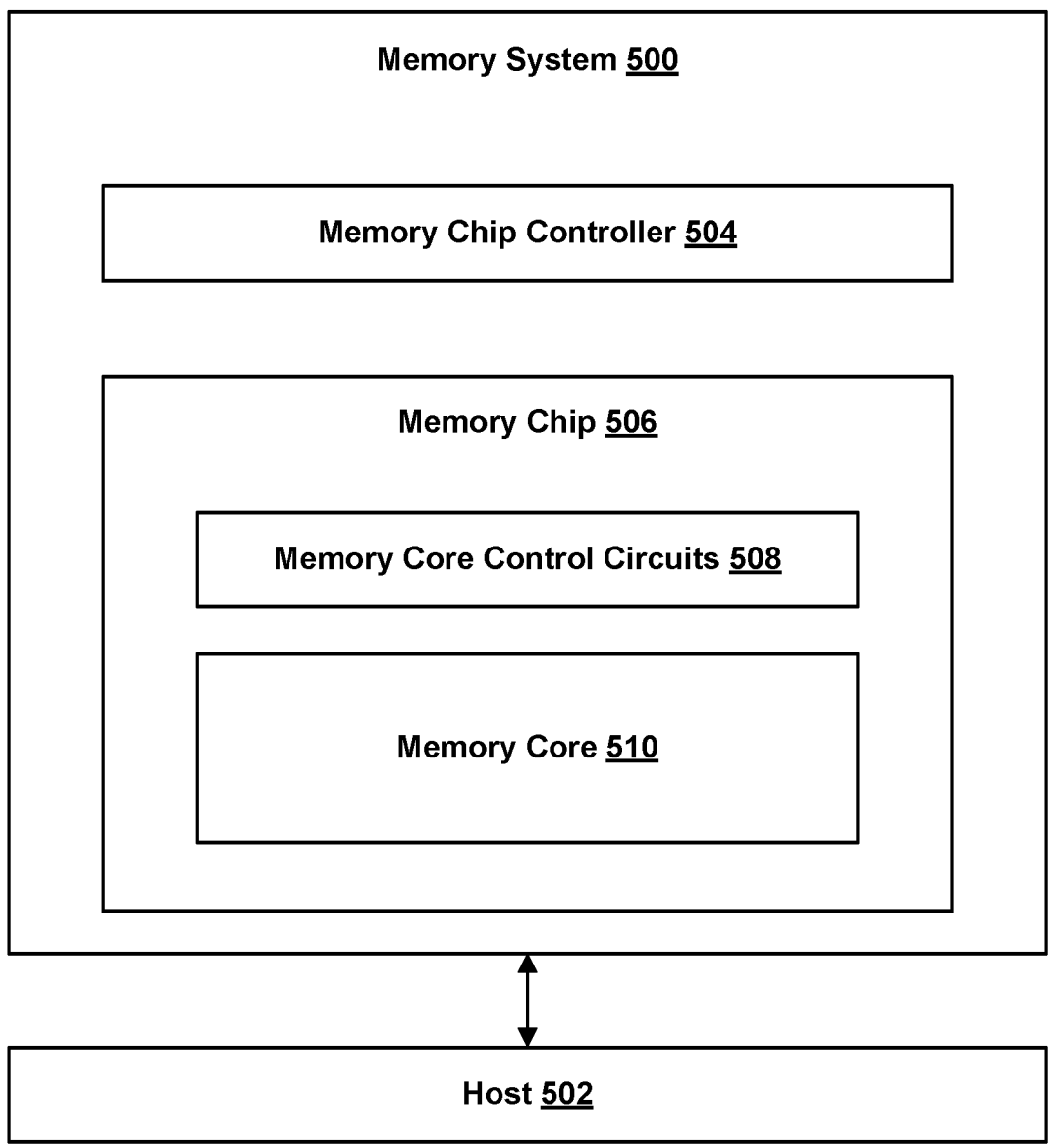
FIG. 5A depicts an embodiment of a memory system and a host.

An example memory system 500 that can implement the described technology. FIG. 5A depicts an embodiment of a memory system 500 and a host 502. Memory system 500 may include a non-volatile storage system interfacing with host 502 (e.g., a mobile computing device). In some cases, memory system 500 may be embedded within host 502. In other cases, memory system 500 may include a memory card.

As depicted, memory system 500 includes a memory chip controller 504 and a memory chip 506. Although a single memory chip 506 is depicted, memory system 500 may include more than one memory chip (e.g., four, eight or some other number of memory chips). Memory chip controller 504 may receive data and commands from host 502 and provide data to host 502.

Memory chip controller 504 may include one or more state machines, page registers, SRAM, decoders, sense amplifiers, and control circuitry for controlling the operation of memory chip 506. The one or more state machines, page registers, SRAM, and control circuitry for controlling the operation of memory chip 506 may be referred to as managing or control circuits. The managing or control circuits may facilitate one or more memory operations, such as programming, reading (or sensing) and erasing operations.

In some embodiments, the managing or control circuits (or a portion of the managing or control circuits) that facilitate one or more memory array operations, including programming, reading, and erasing operations, may be integrated within memory chip 506. In some embodiments, the managing or control circuits may include an on-chip memory controller for determining row and column address, bit line, source line and word line addresses, memory array enable signals, and data latching signals.

Memory chip controller 504 and memory chip 506 may be arranged on a single integrated circuit. In other embodiments, memory chip controller 504 and memory chip 506 may be arranged on different integrated circuits. In some cases, memory chip controller 504 and memory chip 506 may be integrated on a system board, logic board, or a PCB.

Memory chip 506 includes memory core control circuits 508 and a memory core 510. In an embodiment, memory core control circuits 508 include circuits that generate row and column addresses for selecting memory blocks (or arrays) within memory core 510, and generating voltages to bias a particular memory array into a read or a write state.

Memory chip controller 504 controls operation of memory chip 506. In an embodiment, once memory chip controller 504 initiates a memory operation (e.g., read, write, or multiply), memory core control circuits 508 generate the appropriate bias voltages for bit lines, source lines and/or word lines within memory core 510, and generates the appropriate memory block, row, and column addresses to perform memory operations.

In an embodiment, memory core 510 includes one or more arrays of non-volatile memory cells. In an embodiment, memory core 510 includes one or more arrays of MRAM non-volatile memory cells, such as any of the MRAM non-volatile memory cells described above. Memory core 510 may include one or more two-dimensional or three-dimensional arrays of MRAM non-volatile memory cells.

In an embodiment, memory core control circuits 508 and memory core 510 are arranged on a single integrated circuit. In other embodiments, memory core control circuits 508 (or a portion of memory core control circuits 508) and memory core 510 may be arranged on different integrated circuits.

In an embodiment, memory core 510 includes a three-dimensional memory array of MRAM non-volatile memory cells in which multiple memory levels are formed above a single substrate, such as a wafer. The memory structure may include MRAM non-volatile memory that is monolithically formed in one or more physical levels of arrays of non-volatile memory cells having an active area disposed above a silicon (or other type of) substrate.

Figure 5B:
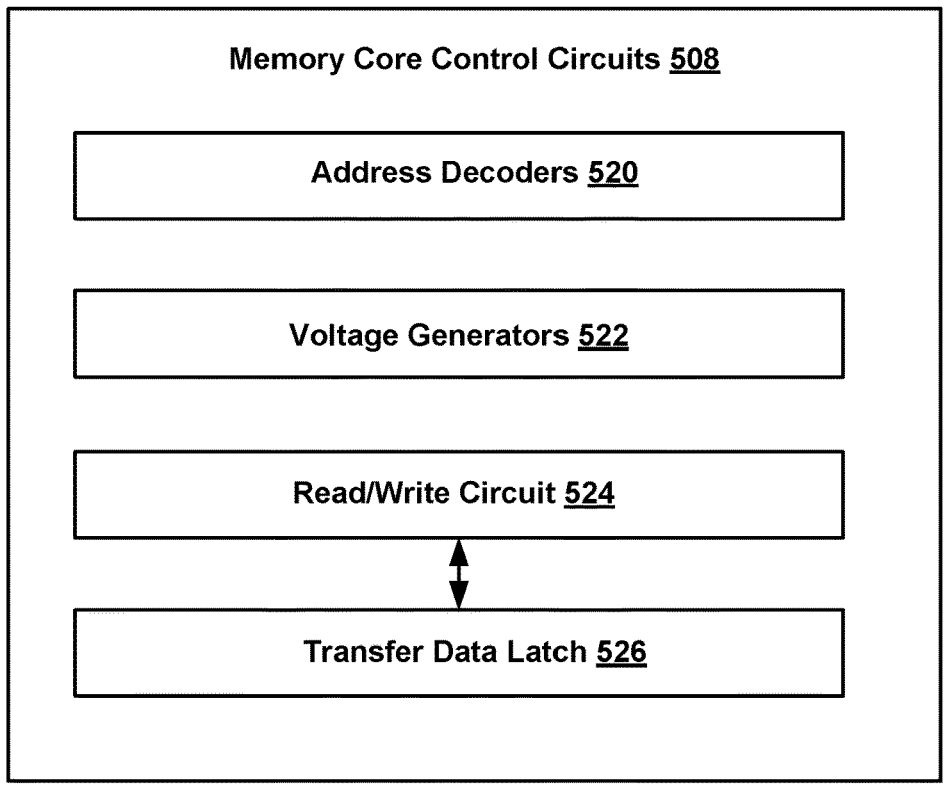
FIG. 5B depicts an embodiment of memory core control circuits.

FIG. 5B depicts an embodiment of memory core control circuits 508. As depicted, memory core control circuits 508 include address decoders 520, voltage generators 522, read/write circuit 524, and transfer data latch 526. In an embodiment, address decoders 520 generate memory block addresses, as well as row addresses and column addresses for a particular memory block. In an embodiment, voltage generators (or voltage regulators) 522 generate voltages for control lines.

Read/write circuit 524 includes circuitry for reading and writing non-volatile memory cells in memory core 510. In an embodiment, transfer data latch 526 is used for intermediate storage between memory chip controller 504 (FIG. 5A) and non-volatile memory cells. In an embodiment, transfer data latch 526 has a size equal to a size of a page.

In an embodiment, when host 502 instructs memory chip controller 504 to write data to memory chip 506, memory chip controller 504 writes a page of host data to transfer data latch 526. Read/write circuit 524 then writes data from transfer data latch 526 to a specified page of non-volatile memory cells.

In an embodiment, when host 502 instructs memory chip controller 504 to read data from memory chip 506, read/write circuit 524 reads from a specified page of non-volatile memory cells into transfer data latch 526, and memory chip controller 504 transfers the read data from transfer data latch 526 to host 502.

In a read operation, after a read voltage is applied the MRAM memory cell current may be sensed and compared with a reference current to determine which state the memory cell is in. For example, the magnitude of the read voltage may be compared to a reference current to delineate between the two states.

Figure 5C:
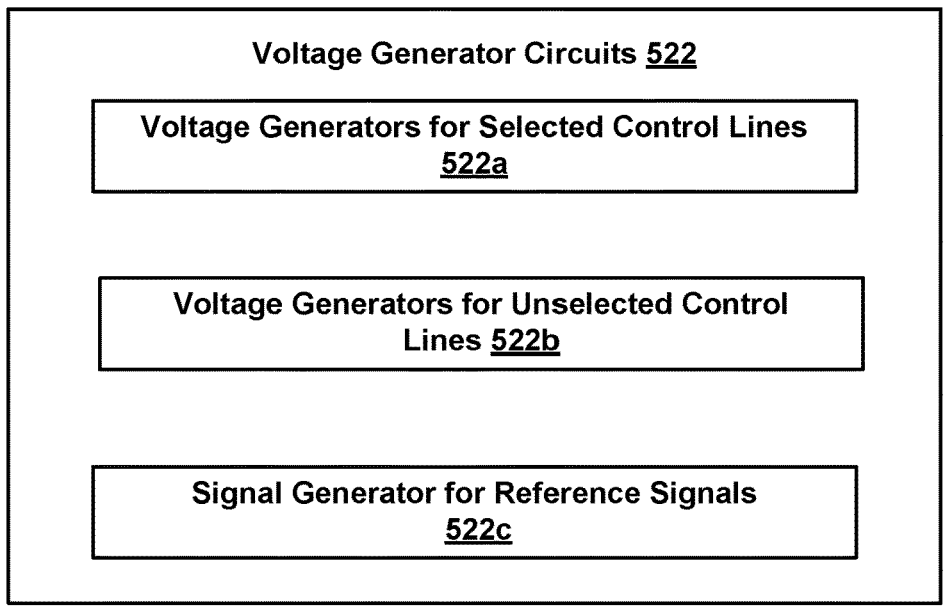
FIG. 5C depicts further details of one embodiment of voltage generators.

FIG. 5C depicts further details of an embodiment of voltage generator circuits 522, which includes voltage generators for selected control lines 522a, voltage generators for unselected control lines 522b, and signal generators for reference signals 522c. Control lines may include bit lines, source lines and word lines, or a combination of bit lines, source lines and word lines.

Voltage generators for selected control lines 522a may be used to generate program and/or read voltages. Voltage generators for unselected control lines 522b may be used to generate voltages for control lines that are connected to memory cells that are not selected for a program or read operation. Signal generators for reference signals 522c may be used to generate reference signals (e.g., currents, voltages) to be used as a comparison signal to determine the physical state of a memory cell.

One embodiment includes an apparatus including a magnetic tunnel junction, a magnetic assist layer coupled to the magnetic tunnel junction, a non-magnetic layer disposed between the free layer and the magnetic assist layer, and a spin Hall effect layer coupled to the magnetic assist layer. The magnetic tunnel junction includes a free layer in a plane, the free layer including a switchable magnetization direction perpendicular to the plane. The magnetic assist layer includes a magnetization direction parallel to the plane and free to rotate about an axis perpendicular to the plane.

One embodiment includes a method including applying for a first time interval a first voltage pulse across a first terminal and a second terminal of a spin Hall effect layer that is coupled to a stack including a magnetic assist layer, a non-magnetic layer and a magnetic tunnel junction that includes a free layer in a plane, the free layer including a switchable magnetization direction perpendicular to the plane, the magnetic assist layer including a magnetization direction parallel to the plane and free to rotate about an axis perpendicular to the plane, applying for a second time interval a second voltage pulse across the second terminal and a third terminal coupled to the magnetic tunnel junction, the second time interval longer than the first time interval, and the first time interval overlapping a portion of the second time interval, and switching the magnetization direction of the free layer.

One embodiment includes an MRAM non-volatile memory cell including a spin Hall effect layer, a magnetic tunnel junction that includes a free layer in a plane, the free layer including a switchable magnetization direction perpendicular to the plane, and a magnetic assist layer disposed between the spin Hall effect layer and the magnetic tunnel junction, the magnetic assist layer including a magnetization direction parallel to the plane and free to rotate about an axis perpendicular to the plane. The spin Hall effect layer is configured to turn ON and turn OFF torque provided by the magnetic assist layer to assist switching the magnetization direction of the free layer.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a magnetic tunnel junction that includes a free layer in a plane, the free layer comprising a switchable magnetization direction perpendicular to the plane;
a magnetic assist layer coupled to the magnetic tunnel junction, the magnetic assist layer comprising a magnetization direction parallel to the plane and free to rotate about an axis perpendicular to the plane;

a non-magnetic layer disposed between the free layer and the magnetic assist layer; and a spin Hall effect layer coupled to the magnetic assist layer.

2. The apparatus of claim 1, wherein the spin Hall effect layer is configured to selectively control oscillation of the magnetization direction of the magnetic assist layer.

3. The apparatus of claim 1, wherein in response to a first voltage pulse applied across the spin Hall effect layer, a spin orbit torque is applied to the magnetic assist layer causing the magnetization direction of the magnetic assist layer to oscillate around an axis normal to the plane.

4. The apparatus of claim 3, wherein in response to a second voltage pulse applied across the magnetic tunnel junction and the magnetic assist layer, a spin transfer torque is applied to the free layer causing the magnetization direction of the free layer to begin precessing.

5. The apparatus of claim 4, further comprising circuitry configured to apply the second voltage pulse across the magnetic tunnel junction and the magnetic assist layer at a same starting time as a starting time when the first voltage pulse is applied across the spin Hall effect layer.

6. The apparatus of claim 4, further comprising circuitry configured to apply the second voltage pulse across the magnetic tunnel junction and the magnetic assist layer at a starting time after a starting time when the first voltage pulse is applied across the spin Hall effect layer.

7. The apparatus of claim 4, further comprising circuitry configured to control the timing of the first and second voltage pulses so that the first voltage pulse is terminated before the second voltage pulse.

8. The apparatus of claim 1, wherein in response to a first voltage pulse applied across the spin Hall effect layer, the magnetization direction of the magnetic assist layer oscillates around an axis normal to the plane.

9. The apparatus of claim 8, wherein in response to a second voltage pulse applied across the magnetic tunnel junction and the magnetic assist layer, the magnetization direction of the free layer begins precessing.

10. The apparatus of claim 1, further comprising a first terminal coupled to a first end of the spin Hall effect layer, a second terminal coupled to a second end of the spin Hall effect layer, and a third terminal coupled to the magnetic tunnel junction.

11. A method comprising:

applying for a first time interval a first voltage pulse across a first terminal and a second terminal of a spin Hall effect layer that is coupled to a stack comprising a magnetic assist layer, a non-magnetic layer and a magnetic tunnel junction that includes a free layer in a plane, the free layer comprising a switchable magnetization direction perpendicular to the plane, the magnetic assist layer comprising a magnetization direction parallel to the plane and free to rotate about an axis perpendicular to the plane;

applying for a second time interval a second voltage pulse across the second terminal and a third terminal coupled to the magnetic tunnel junction, the second time interval longer than the first time interval, and the first time interval overlapping a portion of the second time interval; and switching the magnetization direction of the free layer.

12. The method of claim 11, wherein the second time interval starts at a same time as the first time interval.

13. The method of claim 11, wherein the second time interval starts after the first time interval.

14. The method of claim 11, further comprising turning OFF the first voltage pulse before turning OFF the second voltage pulse.

15. The method of claim 11, further comprising selectively controlling oscillation of the magnetization direction of the magnetic assist layer.

16. The method of claim 11, wherein in response to the first voltage pulse, the magnetization direction of the magnetic assist layer oscillates around an axis normal to the plane.

17. The method of claim 11, wherein in response to the second voltage pulse, the magnetization direction of the free layer begins precessing.

18. The method of claim 11, wherein the spin Hall effect layer comprises any of a heavy metal and a topological insulator.

19. An MRAM non-volatile memory cell comprising:

a spin Hall effect layer;

a magnetic tunnel junction that includes a free layer in a plane, the free layer comprising a switchable magnetization direction perpendicular to the plane; and a magnetic assist layer disposed between the spin Hall effect layer and the magnetic tunnel junction, the magnetic assist layer comprising a magnetization direction parallel to the plane and free to rotate about an axis perpendicular to the plane, wherein the spin Hall effect layer is configured to turn ON and turn OFF torque provided by the magnetic assist layer to assist switching the magnetization direction of the free layer.

20. The MRAM non-volatile memory cell of claim 19, wherein to turn ON the torque:

a first voltage pulse is applied across the spin Hall effect layer to generate a spin orbit torque to cause the magnetization direction of the magnetic assist layer to oscillate, and a second voltage pulse across is applied across the magnetic tunnel junction and the magnetic assist layer to generate a spin transfer torque to cause the magnetization direction of the free layer to deterministically switch.

* * * * *